(12) United States Patent
Dozaka

(10) Patent No.: US 11,600,347 B2
(45) Date of Patent: Mar. 7, 2023

(54) STORAGE DEVICE

(71) Applicants: Kabushiki Kaisha Toshiba, Tokyo (JP); Toshiba Electronic Devices & Storage Corporation, Tokyo (JP)

(72) Inventor: Toshiaki Dozaka, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 17/004,823

(22) Filed: Aug. 27, 2020

(65) Prior Publication Data
US 2021/0295934 A1 Sep. 23, 2021

(30) Foreign Application Priority Data
Mar. 19, 2020 (JP) .............. JP2020-049936

(51) Int. Cl.
*G11C 17/00* (2006.01)
*G11C 17/18* (2006.01)
*H03K 19/20* (2006.01)
*G11C 17/08* (2006.01)

(52) U.S. Cl.
CPC .............. *G11C 17/18* (2013.01); *G11C 17/08* (2013.01); *H03K 19/20* (2013.01)

(58) Field of Classification Search
CPC ................ G11C 11/409; G11C 7/1051; G11C 2207/2281; G11C 17/08; G11C 17/18
See application file for complete search history.

(56) References Cited

U.S. PATENT DOCUMENTS

| | | | | |
|---|---|---|---|---|
| 4,635,234 A * | 1/1987 | Yamaguchi | .......... | G11C 7/1051 365/189.05 |
| 6,295,240 B1 * | 9/2001 | Choi | .................... | G11C 7/1048 365/207 |
| 7,116,306 B2 | 10/2006 | Lin | | |
| 7,196,950 B2 | 3/2007 | Kanda et al. | | |
| 7,417,918 B1 * | 8/2008 | Hao | ........................ | G11C 29/02 326/38 |

(Continued)

FOREIGN PATENT DOCUMENTS

| | | | |
|---|---|---|---|
| JP | 2004-152405 A | | 5/2004 |
| JP | 2006-012211 A | | 1/2006 |

(Continued)

*Primary Examiner* — Mushfique Siddique
(74) *Attorney, Agent, or Firm* — Allen & Overy LLP

(57) ABSTRACT

According to an embodiment, a storage device includes a plurality of storage elements, a plurality of readout circuits, and a delay circuit. The readout circuits include a first readout circuit and a second readout circuit different from the first readout circuit. The readout circuits each determines data stored in a corresponding one of the storage elements and outputs a result of the determination, in response to receipt of an activation signal. The delay circuit is connected at a first end to the first readout circuit and connected at a second end to the second readout circuit. The delay circuit supplies the activation signal to the second readout circuit with a time interval after supplying the activation signal to the first readout circuit.

20 Claims, 11 Drawing Sheets

(56) References Cited

U.S. PATENT DOCUMENTS

| | | | |
|---|---|---|---|
| 7,477,561 B2* | 1/2009 | Hirabayashi | G11C 11/419 365/208 |
| 7,495,310 B2 | 2/2009 | Douzaka et al. | |
| 7,590,018 B2* | 9/2009 | Namekawa | G11C 7/065 365/205 |
| 9,747,960 B2* | 8/2017 | La Fratta | G11C 7/1006 |
| 2001/0012233 A1* | 8/2001 | Hirabayashi | G11C 7/1012 365/233.1 |
| 2005/0226078 A1* | 10/2005 | Ito | G11C 17/16 365/230.03 |
| 2009/0027973 A1* | 1/2009 | Nakayama | G11C 17/18 365/189.05 |
| 2012/0147683 A1* | 6/2012 | Midorikawa | G11C 7/227 365/194 |
| 2013/0051114 A1* | 2/2013 | Kim | G11C 7/067 365/145 |
| 2015/0226078 A1* | 8/2015 | Perrot | F04D 29/526 415/173.4 |
| 2016/0329107 A1* | 11/2016 | Ryu | G11C 7/02 |
| 2018/0108425 A1* | 4/2018 | Lee | G11C 17/16 |
| 2020/0294609 A1* | 9/2020 | Dozaka | G11C 29/027 |
| 2020/0294619 A1 | 9/2020 | Young et al. | |

FOREIGN PATENT DOCUMENTS

| | | |
|---|---|---|
| JP | 2008-159183 A | 7/2008 |
| JP | 2012-022740 A | 2/2012 |
| JP | 2020-149749 A | 9/2020 |

* cited by examiner

STORAGE DEVICE

CROSS-REFERENCE TO RELATED APPLICATIONS

This application is based upon and claims the benefit of priority from Japanese Application No. 2020-049936, filed on Mar. 19, 2020, the entire contents of which are incorporated herein by reference.

FIELD

Embodiments described herein relate generally to a storage device.

BACKGROUND

Conventionally, storage devices including a plurality of storage elements have been available.

DETAILED DESCRIPTION

According to one embodiment, in general, a storage device includes a plurality of storage elements, a plurality of readout circuits, and a delay circuit. The readout circuits include a first readout circuit and a second readout circuit different from the first readout circuit. The readout circuits each determines data stored in a corresponding one of the storage elements and outputs a result of the determination, in response to receipt of an activation signal. The delay circuit is connected at a first end to the first readout circuit and connected at a second end to the second readout circuit. The delay circuit supplies the activation signal to the second readout circuit with a time interval after supplying the activation signal to the first readout circuit.

The storage device according to one embodiment represents, for example, a one-time programmable (OTP) memory. The following will describe an OTP memory to which a technique based on an embodiment is applied, as an example. The embodiment is applicable to memories other than the OTP memory. Hereinafter, an OTP memory will be described in detail as an exemplary storage device according to one embodiment, with reference to the accompanying drawings. Embodiments described herein are presented for illustrative purpose only and not intended to limit the scope of the present invention.

First Embodiment

Figure 1:
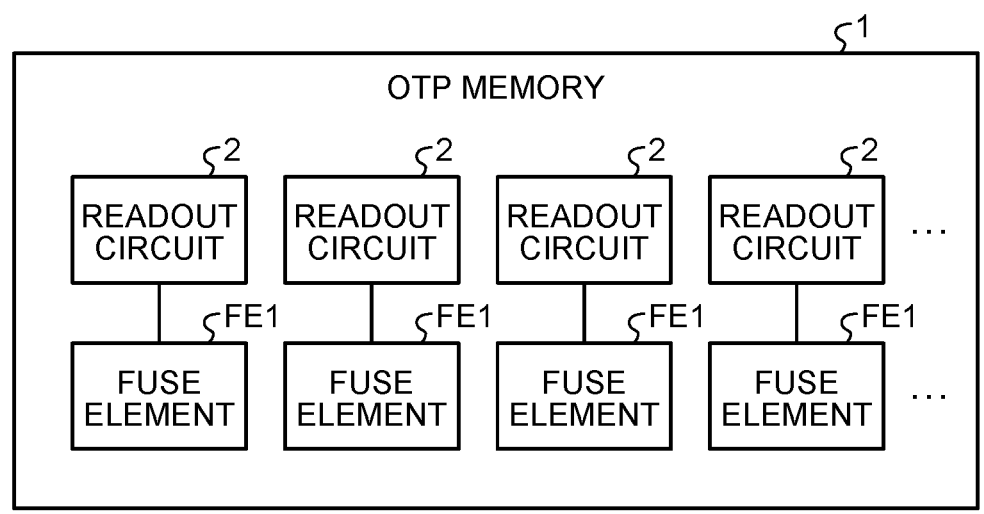
FIG. 1 is a schematic diagram illustrating an exemplary configuration of an OPT memory according to a first embodiment.

FIG. 1 is a schematic diagram illustrating an exemplary configuration of an OPT memory according to a first embodiment. As illustrated in FIG. 1, an OTP memory 1 includes a plurality of fuse elements FE1 and a plurality of readout circuits 2. The fuse elements FE1 and the readout circuits 2 are mutually connected one to one.

The fuse elements FE1 are exemplary storage elements. The fuse elements FE1 are, for example, fast acting fuse elements. The fuse elements FE1 are not limited to this example. The fuse elements FE1 can be, for example, gate-breakdown fuse elements. The storage elements are not limited to the fuse elements FE1.

After receiving a SAE signal serving as an activation signal, the readout circuits 2 can each determine the data of the corresponding one of the fuse elements FE1 in connection for output.

Figure 2:
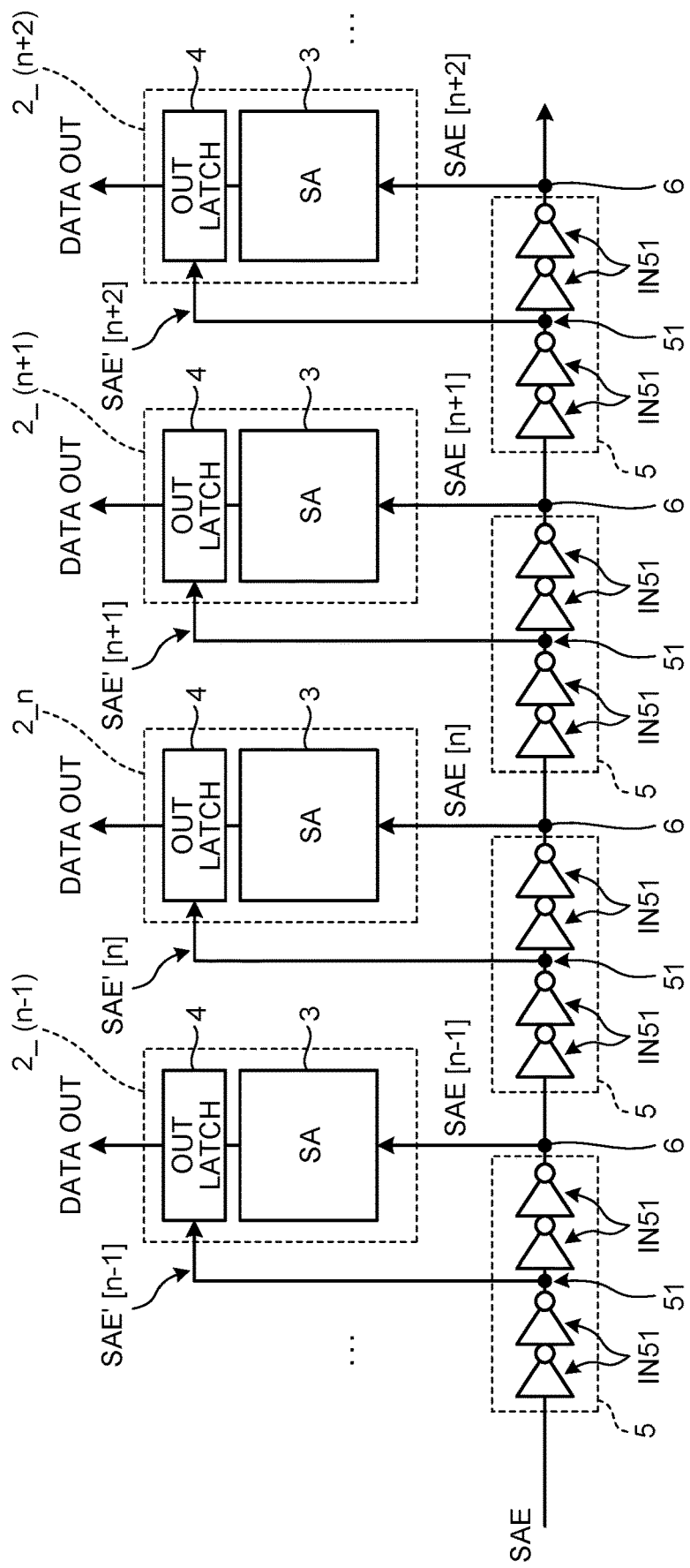
FIG. 2 is a schematic diagram illustrating an example of connection between signal lines of SAE signals and a plurality of readout circuits according to the first embodiment.

FIG. 2 is a schematic diagram illustrating an example of connection between signal lines of the SAE signals and the readout circuits 2 in the first embodiment. FIG. 2 illustrates, as an example, four readout circuits $2\_(n-1)$, $2\_n$, $2\_(n+1)$, and $2\_(n+2)$ where n is an integer, among the plurality of readout circuits 2. FIG. 2 omits showing the fuse elements FE1 connected to the readout circuits 2.

Each of the four readout circuits $2\_(n-1)$, $2\_n$, $2\_(n+1)$, and $2\_(n+2)$ includes a sense amplifier circuit (SA) 3 and an output latch circuit (OUT LATCH) 4. All the readout circuits 2 include the sense amplifier circuits 3 of the same configuration, for example. Further, all the readout circuits 2 include the output latch circuits 4 of the same configuration, for example. The output latch circuit 4 is an exemplary output circuit.

The sense amplifier circuits 3 of all the readout circuits 2 may not have the same configuration. Further, the output latch circuit 4 of all the readout circuits 2 may not have the same configuration.

Each sense amplifier circuit 3 determines the data stored in the corresponding fuse element FE1. The output latch circuit 4 latches a result of the determination by the sense amplifier circuit 3 for output.

The OTP memory 1 further includes a plurality of delay circuits 5 arranged in series through the SAE signal line. There is one branch point 6 downstream of each delay circuit 5. The branch points 6 are connected to the readout circuits 2, respectively. Herein, the readout circuit $2\_(n-1)$, the readout circuit $2\_n$, the readout circuit $2\_(n+1)$, and the readout circuit 2_(n+2) are connected to the different branch points 6 in this order from the upstream side of the SAE signal line.

Thus, among the four readout circuits 2_(n−1), 2_n, 2_(n+1), and 2_(n+2), one readout circuit 2_x (where x is an integer from n−1 to n+1 in this example) and the readout circuit 2_(x+1) adjacent to the downstream side of the readout circuit 2_x are connected to each other through one delay circuit 5. That is, each delay circuit 5 is connected at one end to the readout circuit 2_x and connected the other end to the readout circuit 2_(x+1). Each delay circuit 5 can supply the SAE signal to the readout circuit 2_(x+1) with a time interval after supplying the SAE signal to the readout circuit 2_x.

The SAE signal supplied from the branch point 6 to the readout circuit 2_i (where i is an integer from n−1 to n+2 in this example) is denoted by SAE[i]. The SAE signal SAE[i] is input to the sense amplifier circuit 3. The sense amplifier circuit 3 serves to determine the data of the fuse element FE1 at timing based on the SAE[i].

By supplying the SAE signal to one readout circuit 2 and then supplying it to the next readout circuit 2 with a delay, the delay circuit 5 can stagger the operating periods of the readout circuits 2. This makes it possible to lower a peak value of the current flowing through the readout circuits 2 in operation.

The delay circuit 5 may be provided for each of every pair of adjacent readout circuit 2 or for each of part of the pairs. The delay circuit 5 provided for each of all the pairs can stagger the operating periods of all the readout circuits 2. The delay circuit 5 for each of part of the pairs can stagger the operating periods of part of the readout circuits 2.

In the example illustrated in FIG. 2, each delay circuit 5 includes four inverters IN51 functioning as delay elements arranged in series. There is a branch point 51 between the two upstream inverters IN51 and the two downstream inverters IN51 among the four inverters IN51. Each branch point 51 is connected to the readout circuit 2 connected to the branch point 6 between the corresponding branch point 51 and the adjacent branch point 51 on the downstream side.

The SAE signal supplied to the readout circuit 2_i via the branch point 51 is denoted by SAE'[i]. The signal SAE'[i] is input to the output latch circuit 4. The output latch circuit 4 can latch a result of the determination by the sense amplifier circuit 3 at timing based on the signal SAE'[i].

Figure 3:
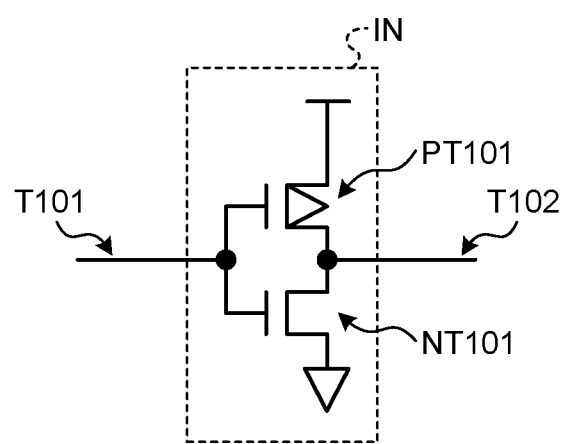
FIG. 3 is a schematic diagram illustrating an exemplary circuit configuration of an inverter included in a delay circuit according to the first embodiment.

The inverters IN51 have a circuit configuration illustrated in FIG. 3, for example. In FIG. 3, an inverter IN includes a PMOS transistor PT101 and an NMOS transistor NT101. The source of the PMOS transistor PT101 is electrically connected to the power-supply potential, and the drain of the PMOS transistor PT101 is electrically connected to an output terminal T102. The drain of the NMOS transistor NT101 is electrically connected to the output terminal T102, and the source of the NMOS transistor NT101 is electrically connected to the ground potential. The gate of the PMOS transistor PT101 and the gate of the NMOS transistor NT101 are electrically connected to an input terminal T101. That is, the signal input to the input terminal T101 is logically inverted and then output from the output terminal T102.

The specific circuit configuration of the delay element is not limited to this example. The delay element can be a gate other than the inverter IN.

Figure 4:
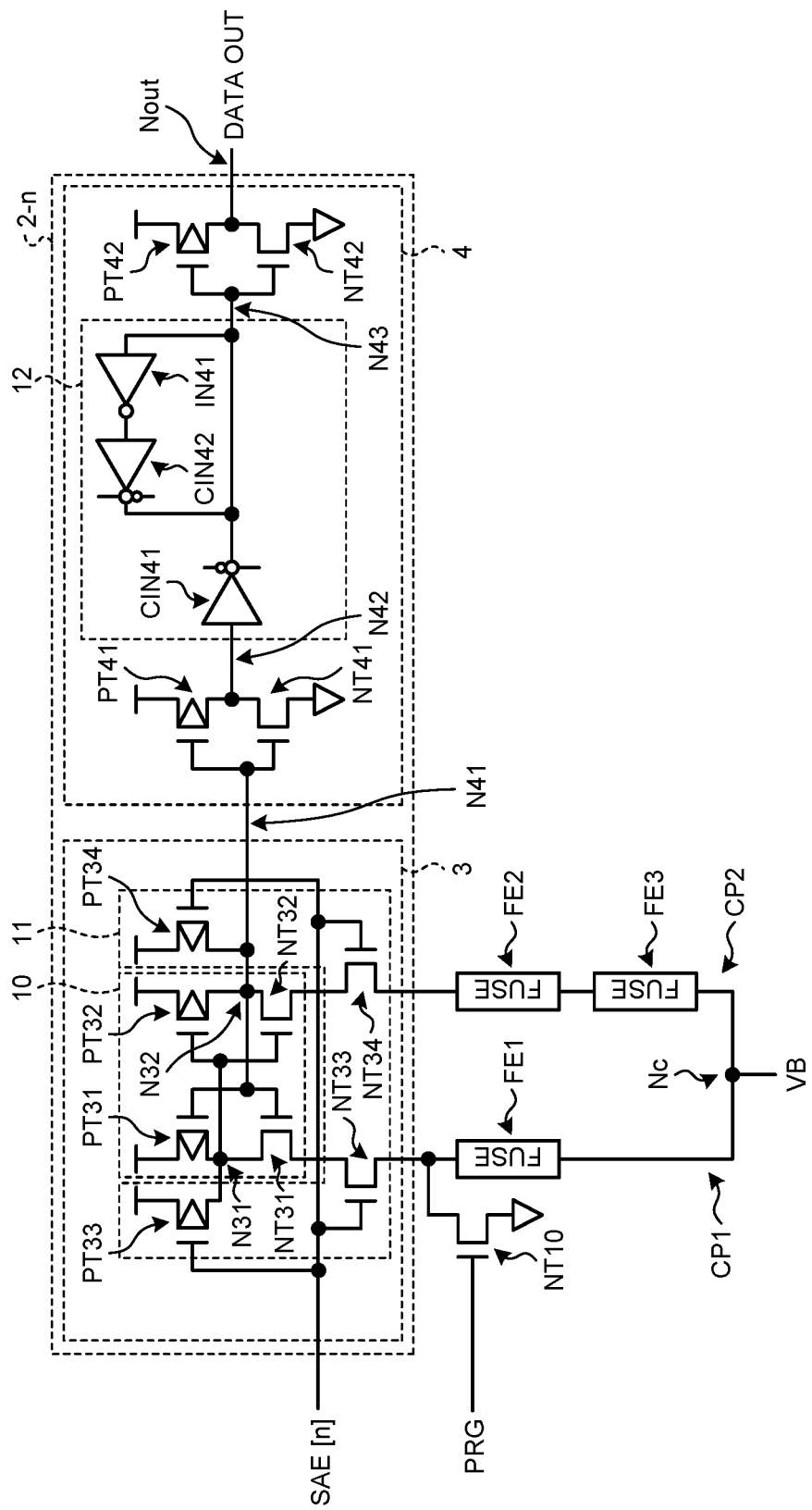
FIG. 4 is a schematic diagram illustrating an exemplary circuit configuration of each readout circuit according to the first embodiment.

FIG. 4 is a schematic diagram illustrating an exemplary circuit configuration of each readout circuit 2 in the first embodiment. The following will describe the configuration of the readout circuit 2_n to be supplied with the SAE[n] as a representative.

The readout circuit 2_n is connected to the fuse element FE1.

The resistance state of the fuse element FE1 differs depending on whether bit information is written to the fuse element FE1. In order to read presence or absence of bit information written to the fuse element FE1, a current path CP1 including the fuse element FE1 and a current path CP2 are aligned in parallel. The current path CP2 serves to invert the magnitude relationship between the resistance values thereof depending on whether bit information is written to the fuse element.

Two fuse elements FE2 and FE3 are juxtaposed in series in the current path CP2 for the purpose of inverting the magnitude relationship between the resistance values of the current paths CP1 and CP2, depending on whether bit information is written to the fuse element. The elements for inverting the magnitude relationship between the resistance values of the current paths depending on whether bit information is written to the fuse element are not limited to the fuse elements. For example, the current path CP2 may be provided with a resistor having a given resistance value.

The sense amplifier circuit 3 of the readout circuit 2_n is connected to the two current paths CP1 and CP2, to be able to determine whether bit information is written to the fuse element FE1, from the magnitude relationship between the resistance values of the two current paths CP1 and CP2.

The current path CP1 and the current path CP2 extend from the power-supply potential to a reference potential VB via a common current path CP3, and are electrically connected to each other in parallel between the power-supply potential and a common node Nc. The common current path CP3 is electrically connected between the common node Nc and the reference potential VB.

The sense amplifier circuit 3 is located closer to the power-supply potential than the fuse elements FE1 to FE3 across the current path CP1 and the current path CP2.

The sense amplifier circuit 3 includes a latch circuit 10 with two internal nodes N31 and N32, and a drive circuit 11 that drives the latch circuit 10 in response to receipt of the SAE[n].

The latch circuit 10 includes an NMOS transistor NT31, a PMOS transistor PT31, an NMOS transistor NT32, and a PMOS transistor PT32.

The NMOS transistor NT31 and the PMOS transistor PT31 are connected together in series in the current path CP1. The gates of the NMOS transistor NT31 and the PMOS transistor PT31 are connected to the current path CP2. The NMOS transistor NT32 and the PMOS transistor PT32 are connected together in series in the current path CP2. The gates of the NMOS transistor NT32 and the PMOS transistor PT32 are connected to the current path CP1.

The internal node N31 is located between the NMOS transistor NT31 and the PMOS transistor PT31 in the current path CP1. The internal node N32 is located between the NMOS transistor NT32 and the PMOS transistor PT32 in the current path CP2.

As described above, the latch circuit 10 includes the two cross-coupled inverters, the one including the NMOS transistor NT31 and the PMOS transistor PT31 and the other including the NMOS transistor NT32 and the PMOS transistor PT32, and includes the internal nodes N31 and N32 in the cross-coupled part. That is, the sense amplifier circuit 3 serves as a cross-coupled latch sense amplifier circuit.

The drive circuit 11 includes an NMOS transistor NT33, an NMOS transistor NT34, a PMOS transistor PT33, and a PMOS transistor PT34.

The source of the NMOS transistor NT31 is electrically connected to the drain of the NMOS transistor NT33, and the source of the NMOS transistor NT33 is electrically connected to the fuse element FE1. The source of the NMOS transistor NT32 is electrically connected to the drain of the NMOS transistor NT34, and the source of the NMOS transistor NT34 is electrically connected to the fuse element FE2.

The PMOS transistor PT33 is electrically connected at the source to the power-supply potential and at the drain to the internal node N31. The PMOS transistor PT34 is electrically connected at the source to the power-supply potential and at the drain to the internal node N32.

The gates of the NMOS transistor NT33, the NMOS transistor NT34, the PMOS transistor PT33, and the PMOS transistor PT34 are supplied with the SAE[n].

During non-active level (for example, L-level) period of the SAE[n], the NMOS transistor NT33 and the NMOS transistor NT34 are maintained in an OFF state while the PMOS transistor PT33 and the PMOS transistor PT34 are maintained in an ON state. Thereby, the two internal nodes N31 and N32 are charged by the power-supply potential and are both maintained at an H-level.

In response to a transition of the SAE[n] from the non-active level to an active level (for example, H-level), the PMOS transistor PT33 and the PMOS transistor PT34 turn off, and the NMOS transistor NT33 and the NMOS transistor NT34 turn on. This causes a potential difference between the internal node N31 and the internal node N32 according to the magnitude relationship between the resistance values of the current path CP1 and the current path CP2, turning one of the internal node N31 and the internal node N32 to the H-level, and the other to the L-level.

Specifically, in a high resistance state of the fuse element FE1 having, for example, the bit information "1" written thereto, the current path CP2 is greater in resistance value than the current path CP1. Thus, the current path CP1 is greater in current value than the current path CP2, turning the internal node N31 to the L-level and the internal node N32 to the H-level.

In a low resistance state of the fuse element FE1 having, for example, the bit information "1" not written thereto, the current path CP2 is lower in resistance value than the current path CP1. Thus, the current path CP1 is lower in current value than the current path CP2, turning the internal node N31 to the H-level and the internal node N32 to the L-level.

That is, in response to a transition of the SAE[n] from the non-active level to the active level, the drive circuit 11 causes the latch circuit 10 to start data determination. In the data determination, one of the internal nodes N31 and N32 corresponding to the data of the fuse element FE1 transitions to the L-level.

The internal node N32 is connected to an input node N41 of the output latch circuit 4. Thus, in response to the SAE[n] transitioning from the non-active level to the active level, the drive circuit 11 drives the sense amplifier circuit 3 to start data determination. As a result, one of the internal nodes N31 and N32 corresponding to the data of the fuse element FE1 transitions to the L-level. After completion of the transition of one of the internal nodes N31 and N32 corresponding to the data of the fuse element FE1, the internal node N32 maintains the H-level if the fuse element FE1 has the bit information "1" written thereto, and the internal node N32 turns to the L-level if the fuse element FE1 has not the bit information "1" written thereto. That is, completion of the transition of one of the internal nodes N31 and N32 corresponding to the data of the fuse element FE1 signifies completion of the data determination on the fuse element FE1. The sense amplifier circuit 3 can continue to output the bit information read from the fuse element FE1 from the internal node N32 to the output latch circuit 4 during a period from the completion of the data determination on the fuse element FE1 to the transition of the SAE[n] to the non-active level.

The output latch circuit 4 includes an NMOS transistor NT41, a PMOS transistor PT41, an output hold circuit 12, an NMOS transistor NT42, and a PMOS transistor PT42.

The NMOS transistor NT41 and the PMOS transistor PT41 are inverter-connected, forming one inverter. The common gate of the NMOS transistor NT41 and the PMOS transistor PT41 is electrically connected to the input node N41, and the common drain of the NMOS transistor NT41 and the PMOS transistor PT41 is electrically connected to a node N42 serving as the input node of the output hold circuit 12.

The output hold circuit 12 includes a clocked inverter CIN41, an inverter IN41, and a clocked inverter CIN42. The input terminal of the clocked inverter CIN41 is electrically connected to the node N42. The output terminal of the clocked inverter CIN41 is electrically connected to a node N43 serving as the output node of the output hold circuit 12. The input terminal of the inverter IN41 is electrically connected to the node N43, and the output terminal of the inverter IN41 is connected to the input terminal of the clocked inverter CIN42. The output terminal of the clocked inverter CIN42 is connected to the node N43.

The inverter IN41 has the same circuit configuration as the inverter IN illustrated in FIG. 3.

Figure 5:
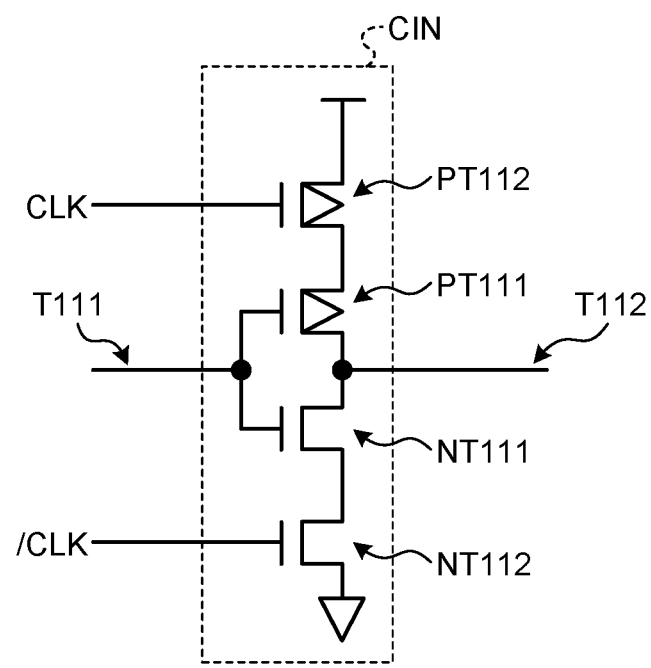
FIG. 5 is a schematic diagram illustrating an exemplary circuit configuration of a clocked inverter included in an output hold circuit according to the first embodiment.

The clocked inverters CIN41 and CIN43 both have a circuit configuration illustrated in FIG. 5, for example. In the example of FIG. 5, the clocked inverter CIN includes a PMOS transistor PT111, an NMOS transistor NT111, a PMOS transistor PT112, and an NMOS transistor NT112. The PMOS transistor PT111 and the NMOS transistor NT111 have the same structure as a general inverter. The common gate of the PMOS transistor PT111 and the NMOS transistor NT111 is electrically connected to an input terminal T111, and the common drain of the PMOS transistor PT111 and the NMOS transistor NT111 is electrically connected to an output terminal T112. The PMOS transistor PT112 is located closer to the power-supply potential than the PMOS transistor PT111, and the NMOS transistor NT112 is located closer to the ground potential. A clock signal CLK is input to the gate of the PMOS transistor PT112, and a clock signal /CLK that is logically inverted with respect to the clock signal CLK is input to the gate of the NMOS transistor NT112. The symbol "/" indicates inversion. As configured above, the clocked inverter CIN is operable as an inverter during the non-active level of the clock signal CLK, and stops operating during the active level of the clock signal CLK.

Returning to FIG. 4, the clocked inverter CIN41 is supplied with a signal /SAE'[n] serving as the clock signal CLK. The signal /SAE'[n] is logically inverted with respect to the signal SAE'[n]. The clocked inverter CIN42 is supplied with the signal SAE'[n] serving as the clock signal CLK. Thereby, the output hold circuit 12 can reflect the logically inverted state of the node N42 in the node N43 during the active level of the SAE'[n]. In response to a transition of the SAE'[n] from the active level to the non-active level, the output hold circuit 12 can continue to hold the node N43 in the state reflected immediately before the transition, during the non-active period of the SAE'[n].

The SAE'[n] transitions at timing slightly earlier than the SAE[n]. During the active level of both the SAE[n] and the SAE'[n], the output hold circuit 12 imports the bit information read from the fuse element FE1. In response to a transition of the SAE[n] from the active level to the non-active level, the sense amplifier circuit 3 ends outputting a result of the determination to the node N41. Before the sense amplifier circuit 3 ends outputting the result of the determination, the output hold circuit 12 starts holding the result of the determination by the SAE'[n]. That is, the output hold circuit 12 can continue to hold the result of the determination after the sense amplifier circuit 3 ends outputting it.

The NMOS transistor NT42 and the PMOS transistor PT42 are inverter-connected, forming one inverter. The common gate of the NMOS transistor NT42 and the PMOS transistor PT42 is electrically connected to the node N43, and the common drain of the NMOS transistor NT42 and the PMOS transistor PT42 is electrically connected to an output node Nout.

The output latch circuit 4 as configured above can output a signal, generated by logically inverting the bit information read by the latch circuit 10 from the fuse element FE1, from the output node Nout for a given period.

The drain of an NMOS transistor NT10 is electrically connected to a node between the source of the NMOS transistor NT33 and the fuse element FE1. The source of the NMOS transistor NT10 is electrically connected to the power-supply potential. The gate of the NMOS transistor NT10 is supplied with a program signal PROG for blowing the fuse element FE1.

By maintaining the program signal PROG at the active level, the NMOS transistor NT10 (write transistor) is maintained in the ON state. Thereby, large current flows through the fuse element FE1 due to the potential difference between the potential of the node Nc and the ground potential, blowing the fuse element FE1 to store a bit value "1". It can be regarded that the fuse element FE1 before being blown stores a bit value "0".

As described above, according to the first embodiment, the delay circuit 5 is placed between the two readout circuits 2. The delay circuit 5 is connected at one end to one of the two readout circuits 2 and at the other end to the other readout circuit 2. The delay circuit 5 supplies the SAE signal serving as an activation signal to one readout circuit 2 and supplies the SAE signal to the other readout circuit 2 with a time interval.

Thus, the delay circuit 5 can cause the two readout circuits 2 to operate at different timing. This makes it possible to lower the peak value of the current flowing through the plurality of fuse elements FE1 at the time of data read therefrom.

In the above, the delay circuit 5 includes the four inverters IN51. In other words, the delay circuit 5 includes four-stage gates.

Meanwhile, the latch circuit 10 includes two cross-coupled inverters as illustrated in FIG. 4. Thus, the delay in the operation of the latch circuit 10 can be considered to be equal to the delay due to one inverter. It can be thus considered that the delay, occurring from the transition of the SAE[n] to the active level to a signal output according to the bit state of the fuse element FE1 to the output node Nout, corresponds to the delay in the four-stage gates in total, that is, the latch circuit 10, the inverter including the NMOS transistor NT41 and the PMOS transistor PT41, the clocked inverter CIN41, and the inverter including the NMOS transistor NT42 and the PMOS transistor PT42.

That is, the number of stages of the gates of the delay circuit 5 is set such that the time taken for one readout circuit 2 to read and output data approximately coincides with or corresponds to the time from supply of the SAE signal to the readout circuit 2 concerned to supply of the SAE signal to the next readout circuit 2.

Thus, the delay circuit 5 can prevent an overlap between the period for which the current flows through one readout circuit 2 and the period for which the current flows through the next readout circuit 2. This can lower the peak current flowing through the fuse element FE1 when data is read therefrom by one readout circuit 2 and the next readout circuit 2, as compared with the two overlapping periods.

When the period for which the current flows in one readout circuit 2 follows, with an interval, the period for which the current flows through the next readout circuit 2, the time taken for reading data is elongated. Setting the period for which the current flows through one readout circuit 2 and the period for which the current flows through the next readout circuit 2 in non-overlapping manner can prevent unnecessary elongation of the time taken for reading data.

That is, by setting the two periods for which the current flows through the one readout circuit 2 and the next readout circuit 2 not to overlap each other, it is possible to efficiently lower the peak value of the current flowing through the plurality of fuse elements FE1 at the time of data read therefrom.

The time taken for one readout circuit 2 to read and output data may not be equal to the time from the supply of the SAE signal to one readout circuit 2 to the supply of the SAE signal to the next readout circuit 2. The delay circuit 5, regardless of the number of stages of the gates thereof, serves to prevent the period for which the current flows through one readout circuit 2 and the period for which the current flows through the next readout circuit 2 from matching each other. This makes it possible to lower the peak value of the current flowing through the plurality of fuse elements FE1 at the time of data read therefrom.

Second Embodiment

Figure 6:
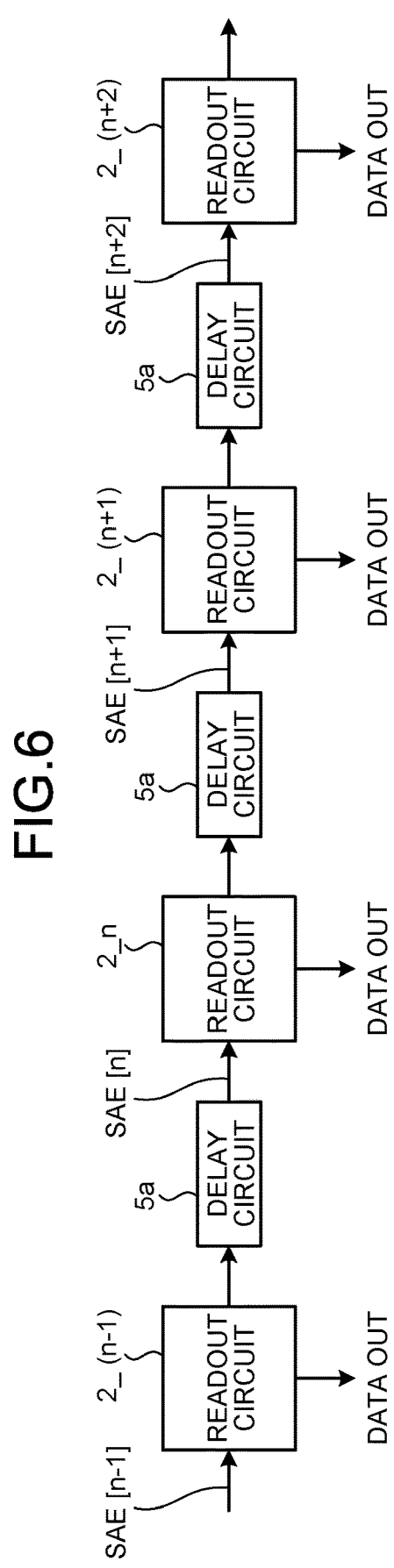
FIG. 6 is a schematic diagram illustrating an example of connection between signal lines of SAE signals and a plurality of readout circuits according to a second embodiment.

Next, a second embodiment will be described. FIG. 6 is a schematic diagram illustrating an exemplary connection between signal lines of the SAE signals and a plurality of readout circuits 2 according to the second embodiment. FIG. 6 depicts, as an example, four readout circuits 2_(n−1), 2_n, 2_(n+1), and 2_(n+2) where n is an integer among the plurality of readout circuits 2.

The four readout circuits 2_(n−1), 2_n, 2_(n+1), and 2_(n+2) have the same configuration as those in the first embodiment. That is, each readout circuit 2 includes a sense amplifier circuit 3 and an output latch circuit 4.

One delay circuit 5a is located between every two adjacent readout circuits 2. Each delay circuit 5a is connected at one end to one of the two readout circuits 2 and connected at the other end to the other of the two readout circuits 2.

Figure 7:
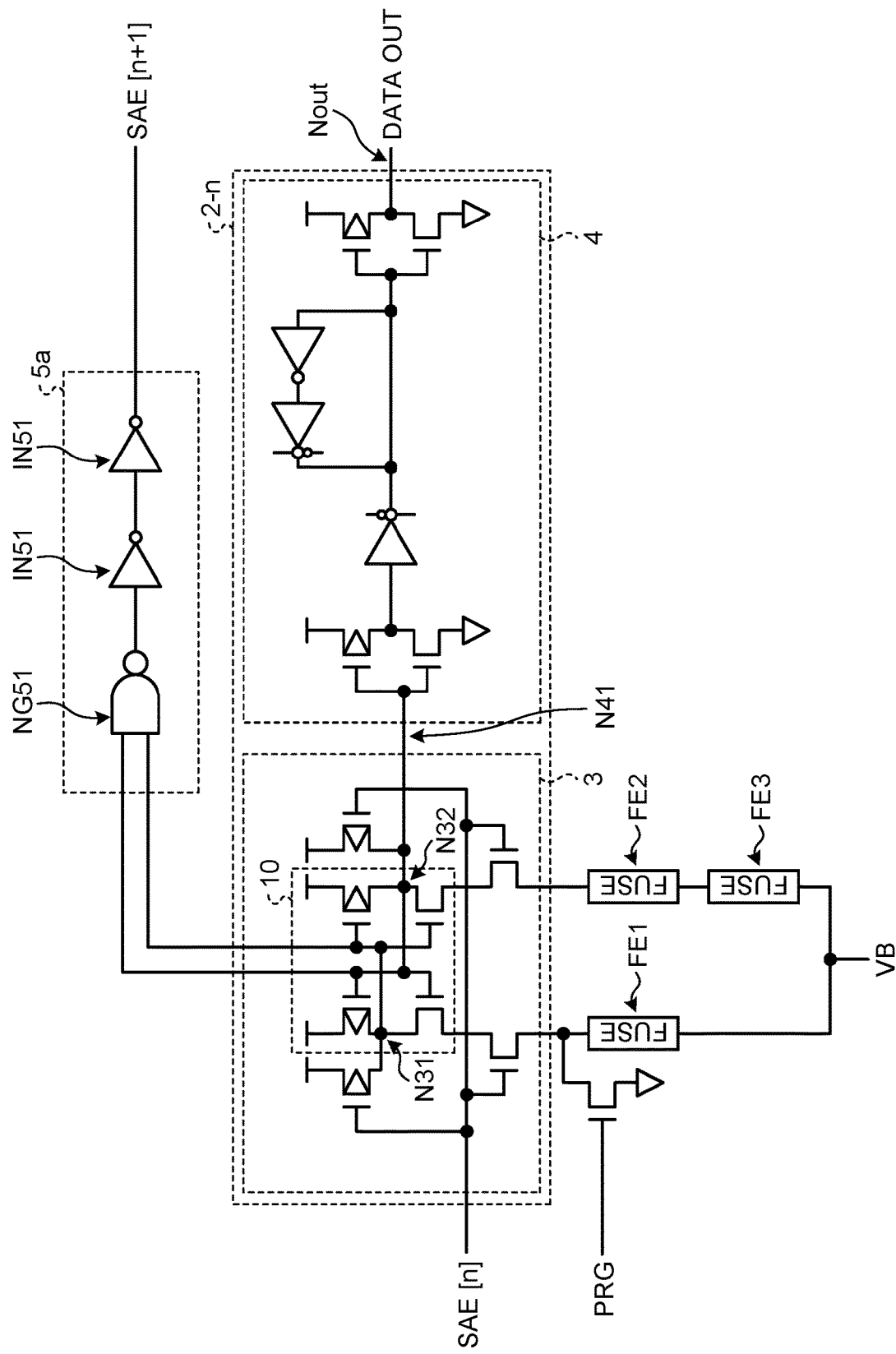
FIG. 7 is a schematic diagram illustrating an exemplary circuit configuration of a delay circuit according to the second embodiment.

FIG. 7 is a schematic diagram illustrating an exemplary circuit configuration of each delay circuit 5a according to the second embodiment. FIG. 7 depicts the circuit configuration of the delay circuit 5a located between the readout circuit 2_n to be supplied with the SAE[n] and the readout circuit 2_(n+1) to be supplied with the SAE[n+1], as a representative.

In the second embodiment, each delay circuit 5*a* includes a NAND gate NG51 and two inverters IN51 connected in series in this order.

Figure 8:
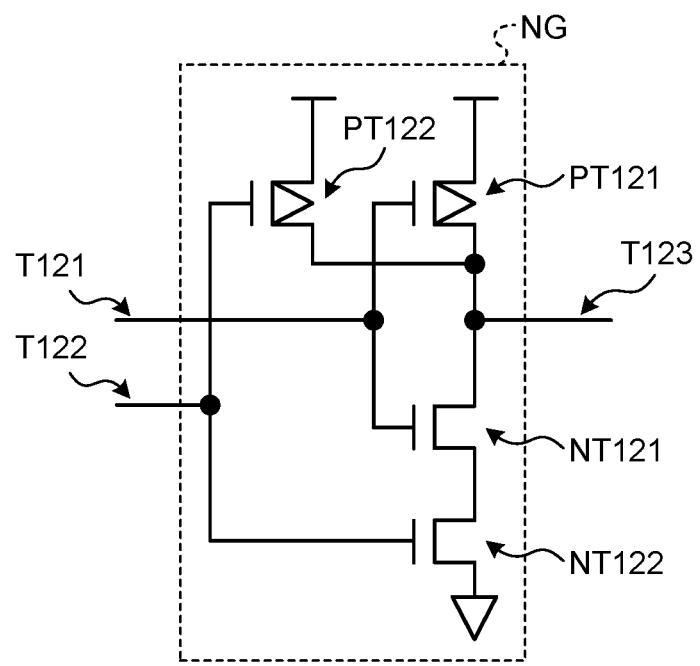
FIG. 8 is a diagram illustrating an exemplary circuit configuration of a NAND gate of the delay circuit according to the second embodiment.

The NAND gate NG51 has a circuit configuration illustrated in FIG. 8, for example. In FIG. 8, the NAND gate NG includes a PMOS transistor PT121, a PMOS transistor PT122, an NMOS transistor NT121, and an NMOS transistor NT122. The PMOS transistor PT121 is electrically connected at the source to the power-supply potential and at the drain to the drain of the NMOS transistor NT121. The source of the NMOS transistor NT121 is electrically connected to the drain of the NMOS transistor NT122. The source of the NMOS transistor NT122 is electrically connected to the ground potential. The PMOS transistor PT122 is electrically connected at the source to the power-supply potential and at the drain to the common drain of the PMOS transistor PT121 and the NMOS transistor NT121. One input terminal T121 of the NAND gate NG is connected to the common gate of the PMOS transistor PT121 and the NMOS transistor NT121. The other input terminal T122 of the NAND gate NG is commonly connected to the gate of the PMOS transistor PT122 and the gate of the NMOS transistor NT122. An output terminal T123 of the NAND gate NG is connected to the common drain of the PMOS transistor PT121 and the NMOS transistor NT121.

Returning to FIG. 7, one of the two input terminals of the NAND gate NG51 is electrically connected to the internal node N31 of the latch circuit 10, and the other of the two input terminals of the NAND gate NG51 is electrically connected to the internal node N32 of the latch circuit 10.

During the non-active level (for example, L-level) of the SAE[n], both the two internal nodes N31 and N32 exhibit the H-level. Thus, during the non-active level of the SAE[n], the output of the NAND gate NG51 is at the L-level.

Along with a transition of the SAE[n] from the non-active level to the active level, one of the two internal nodes N31 and N32, corresponding to the data of the fuse element FE1, transitions to the L-level. Along with the transition of one of the two internal nodes N31 and N32 to the L-level, the output of the NAND gate NG51 transitions from the L-level to the H-level.

Through the above operation, the NAND gate NG51 functions as a sensing circuit that detects completion of the data determination by the sense amplifier circuit 3. The output terminal of the NAND gate NG51 transitions from the L-level to the H-level in response to the completion of the data determination by the sense amplifier circuit 3.

The output signal of the NAND gate NG51 passes through the two stages of the inverters IN51, and the SAE[n+1] is supplied to the sense amplifier circuit 3 of the next readout circuit 2_(*n*+1).

That is, the SAE[n] passes through the latch circuit 10, the NAND gate NG51, and the two stages of the inverters IN51 in this order, and the SAE[n+1] is supplied to the next readout circuit 2_(*n*+1).

Meanwhile, as described in the first embodiment, the delay, occurring from the transition of the SAE[n] to the active level to the output of the signal according to the bit state of the fuse element FE1 to the output node Nout, corresponds to the delay in the four-stage gates in total, that is, the latch circuit 10, the inverter including the NMOS transistor NT41 and the PMOS transistor PT41, the clocked inverter CIN41, and the inverter including the NMOS transistor NT42 and the PMOS transistor PT42.

In reality, however, the signal delay due to the latch circuit 10 is longer than the signal delay due to one inverter.

According to the second embodiment, the delay circuit 5*a* is configured such that the number of stages of gates from the latch circuit 10 to the next readout circuit 2_(*n*+1) in the path through which the SAE[n] and the SAE[n+1] pass while supplied to the readout circuit 2_*n* and the next readout circuit 2_(*n*+1) is equal to the number of stages of gates from the latch circuit 10 to the output node Nout in the path where the SAE[n] reaches the output node Nout.

In the first embodiment the number of stages of the inverters IN51 is set upon the assumption that the signal delay due to the latch circuit 10 is equal to the delay due to one inverter IN51. According to the second embodiment, thus, it is possible to more accurately match the time taken for one readout circuit 2 to read and output data with the time taken from supply of the SAE signal to one readout circuit 2 to supply of the SAE signal to the next readout circuit 2, than according to the first embodiment.

That is, the delay circuit 5*a* can prevent an overlap between the period for which the current flows through the readout circuit 2_*n* and the period for which the current flows through the readout circuit 2_(*n*+1). This can efficiently lower the peak value of the current flowing through the plurality of fuse elements FE1 when data is read therefrom.

As described above, according to the second embodiment, the delay circuit 5*a* includes the NAND logic NG51 serving as the sensing circuit that can detect completion of the data determination. The delay circuit 5*a* can supply the SAE signal to the next readout circuit 2 after the NAND gate NG51 detects the completion of the determination from the state transition of the internal nodes N31 and N32.

Thus, regardless of the length of the delay due to the latch circuit 10, the delay circuit 5*a* can more accurately match the time taken for one readout circuit 2 to read and output data and the time from supply of the SAE signal to one readout circuit 2 to supply of the SAE signal to the next readout circuit 2. This makes it possible to more efficiently lower the peak value of the current flowing through the plurality of fuse elements FE1 when data is read therefrom.

In the second embodiment, the sense amplifier circuit 3 includes the latch circuit 10 having two internal nodes N31 and 32, both of which are at the H-level before the data determination and one of which turns to the L-level after the data determination. The NAND gate NG51 serves as the sensing circuit to detect completion of the data determination from the states of the two internal nodes N31 and 32. The configuration of the sense amplifier circuit 3 is not limited to this example. The sense amplifier circuit 3 and the sensing circuit can be optionally configured as long as the sense amplifier circuit 3 includes a node which makes a state transition at the time of data determination, and the sensing circuit can detect completion of the data determination from the state transition of the node.

Further, in the second embodiment, the number of stages of gates through which the signal passes from the sense amplifier circuit 3 (specifically, the internal nodes N31 and N32) to the next readout circuit 2_(that is, the number of stages of gates in the delay circuit 5*a*) is equal to the number of stages of gates through which the signal passes from the sense amplifier circuit 3 (specifically the internal nodes N31 and N32) to the output node Nout (that is, the number of stages of gates through which the signal passes in the output latch circuit 4). That is, the delay circuit 5*a* is provided with the number of gates corresponding to the amount of delay in the signal from the sense amplifier circuit 3 to the output node Nout. The number of stages of gates through which the signal passes from the sense amplifier circuit 3 to the next readout circuit 2 may not be equal to the number of stages of gates through which the signal passes from the sense amplifier circuit 3 to the output node Nout. In the case of a difference in the numbers of stages of gates, the delay circuit 5a can prevent the period for which the current flows through one readout circuit 2 from matching with the period for which the current flows through the next readout circuit 2 as long as it supplies the SAE signal to the next readout circuit 2 after the sense amplifier circuit 3 completes the data determination. This makes it possible to lower the peak value of the current flowing through the plurality of fuse elements FE1 when data is read therefrom.

Third Embodiment

The signal delay occurs slightly differently when passing through a general inverter IN and when passing through the clocked inverter CIN. In the second embodiment, the signal passes through the clocked inverter CIN41 and the two general inverters from the input node N41 to the output node Nout in the output latch circuit 4.

In order to more accurately match the delay in the SAE signal from the sense amplifier circuit 3 to the next readout circuit 2 and the signal delay from the sense amplifier circuit 3 to the output node Nout, the delay circuit 5a can include a clocked inverter CIN in place of one of the inverters IN51.

Figure 9:
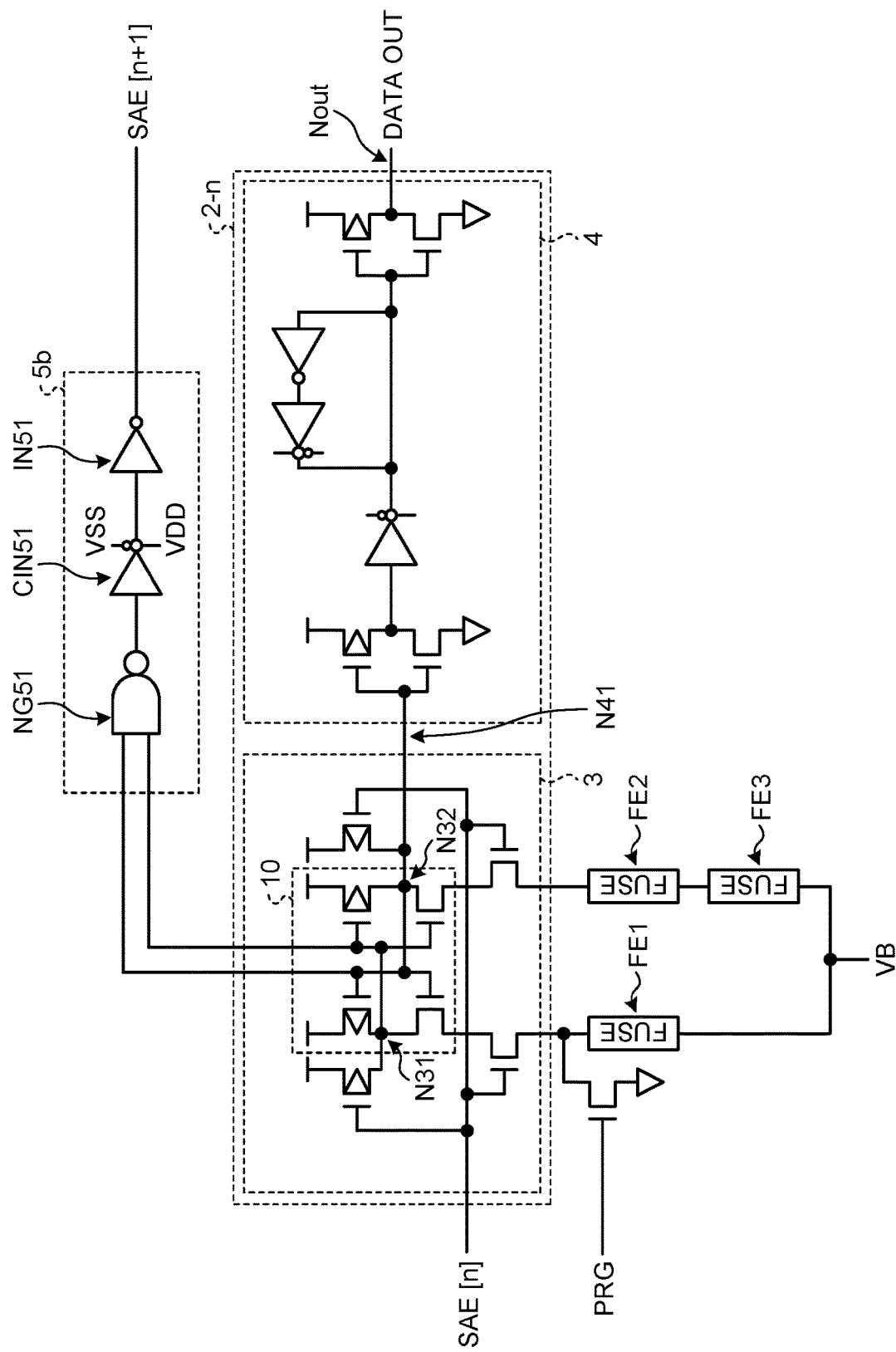
FIG. 9 is a schematic diagram illustrating an exemplary configuration of a delay circuit according to a third embodiment.

FIG. 9 is a schematic diagram illustrating an exemplary configuration of a delay circuit 5b according to a third embodiment. An OTP memory of the third embodiment has the same configuration as that of the second embodiment except for the delay circuit 5b.

As illustrated in FIG. 9, the delay circuit 5b includes a NAND gate NG51, a clocked inverter CIN51, and an inverter IN51 connected in series. The clocked inverter CIN51 has the same configuration as the clocked inverter CIN illustrated in FIG. 5.

In the clocked inverter CIN51, however, the gate of the PMOS transistor PT112 is electrically connected to a VSS potential. The gate of the NMOS transistor NT112 is electrically connected to a VDD potential. Thereby, the clocked inverter CIN51 is made constantly operable.

The delay circuit 5b configured as above can more accurately match the delay in the SAE signal from the sense amplifier circuit 3 to the next readout circuit 2 and the signal delay from the sense amplifier circuit 3 to the output node Nout than that in the second embodiment. As a result, it is possible to more efficiently lower the peak value of the current flowing the plurality of fuse elements FE1 when data is read therefrom.

Fourth Embodiment

Figure 10:
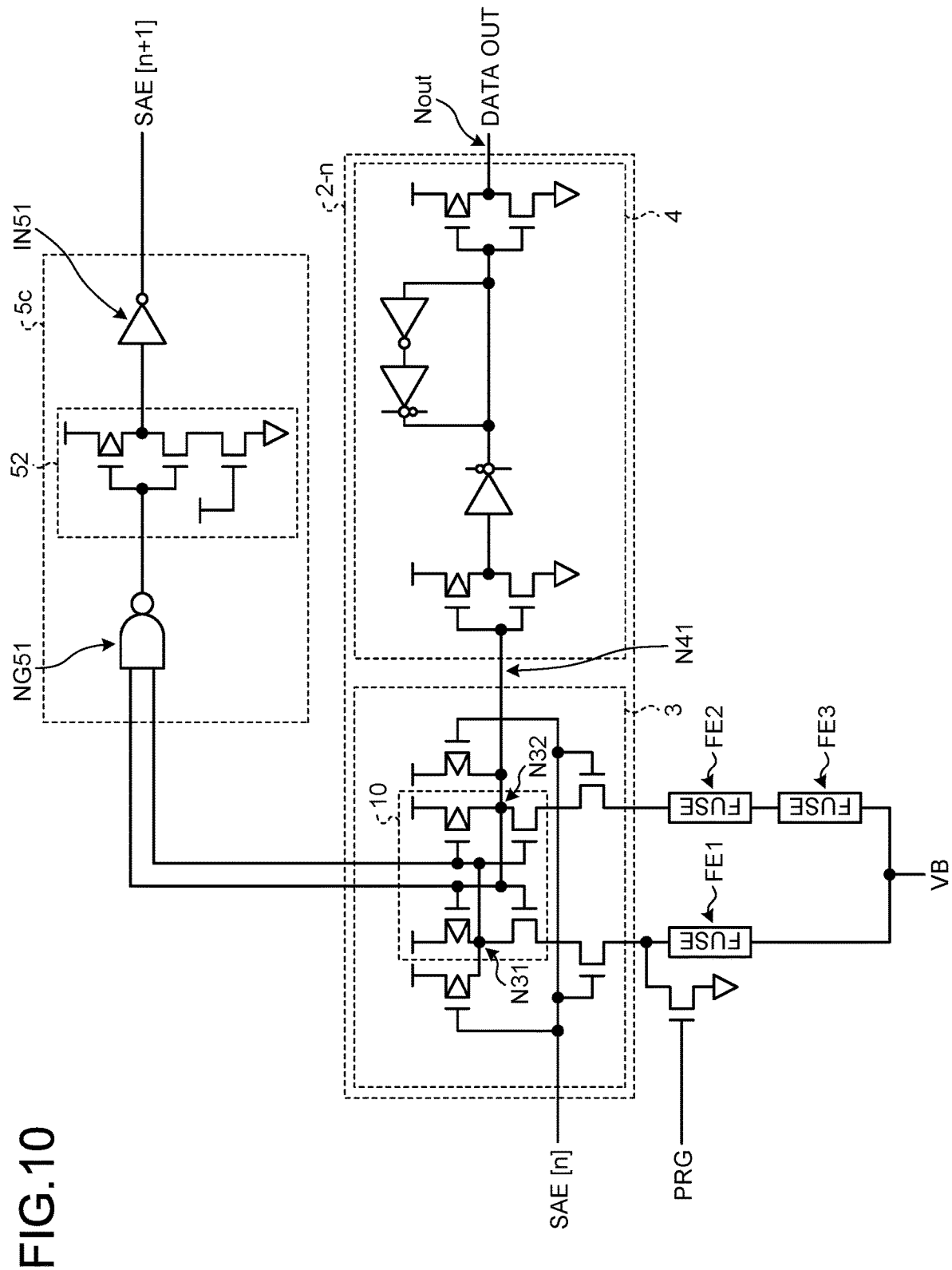
FIG. 10 is a schematic diagram illustrating an exemplary configuration of a delay circuit according to a fourth embodiment.

FIG. 10 is a schematic diagram illustrating an exemplary configuration of a delay circuit 5c according to a fourth embodiment. An OTP memory of the fourth embodiment has the same configuration as that of the second embodiment except for the delay circuit 5b.

As illustrated in FIG. 9, the delay circuit 5c includes a NAND gate NG51, a gate circuit 52, and an inverter IN51 arranged in series. The gate circuit 52 has the same configuration as the clocked inverter CIN illustrated in FIG. 5, for example, except for the PMOS transistor PT112.

In the fourth embodiment, the delay in falling timing of the SAE signal from the sense amplifier circuit 3 to the next readout circuit 2 may not coincide with the signal delay from the sense amplifier circuit 3 to the output node Nout as long as the delay in rising timing of the SAE signal from the sense amplifier circuit 3 to the next readout circuit 2 corresponds to the signal delay from the sense amplifier circuit 3 to the output node Nout.

The circuitry, i.e., the clocked inverter CIN excluding the PMOS transistor PT112, can delay the rising of the SAE signal as with the clocked inverter CIN.

According to the fourth embodiment, the delay circuit 5c, which is smaller in size than the delay circuit 5c of the third embodiment, can attain the same effects as the delay circuit 5b.

Fifth Embodiment

Figure 11:
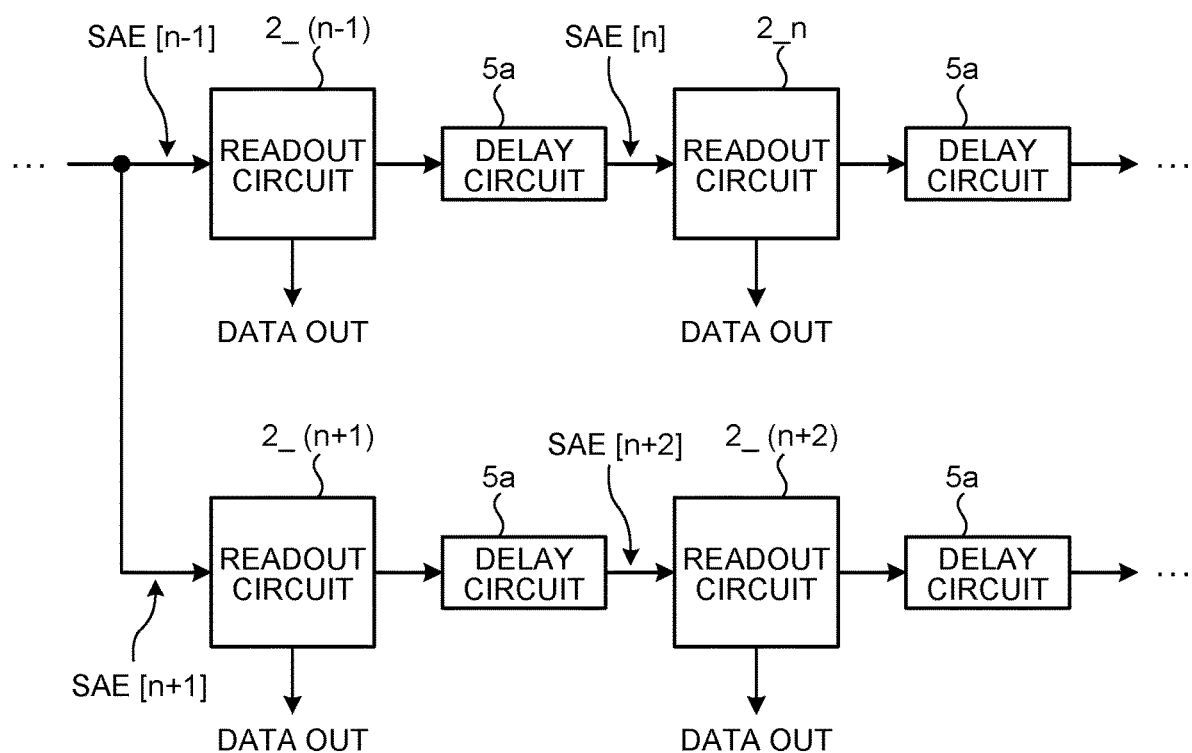
FIG. 11 is a schematic diagram illustrating an example of connection between signal lines of SAE signals and a plurality of readout circuits according to a fifth embodiment.

FIG. 11 is a schematic diagram illustrating an example of connection between signal lines of the SAE signals and a plurality of readout circuits 2 according to a fifth embodiment. FIG. 11 depicts, as an example, four readout circuits 2_(n−1), 2_n, 2_(n+1), and 2_(n+2) where n is an integer, among the plurality of readout circuits 2.

According to the fifth embodiment, as illustrated in FIG. 11, the signal lines of the SAE signals may be laid to supply the SAE signals in parallel to two or more readout circuits 2.

Thereby, it is made possible to shorten the time taken for all of the readout circuits 2 to read and output data as compared with the readout circuits 2 all connected in series, as illustrated in FIG. 6.

FIG. 11 illustrates the connection when the fifth embodiment is applied to the second embodiment. The fifth embodiment can be combined with any of the first to fourth embodiments.

According to the first to fifth embodiments, as described above, each of the delay circuits 5, 5a, 5b, and 5c is connected at one end to the readout circuit 2_x and at the other end to the readout circuit 2_(x+1). The delay circuits 5, 5a, 5b, and 5c each supply the SAE signal to the readout circuit 2_(x+1) with a time interval after supplying the SAE signal to the readout circuit 2_x.

This can lead to lowering the peak value of the current flowing through the plurality of readout circuits 2 when reading data.

According to the second to fifth embodiments, the readout circuit 2 further includes the output latch circuit 4 that outputs the signal corresponding to the states of the internal nodes N31 and N32 as data after the determination. Each of the delay circuits 5a, 5b, and 5c is provided with gates of a number corresponding to amount of delay occurring when the signal passes through the output latch circuit 4.

That is, the delay circuits 5a, 5b, and 5c can work to prevent the operating periods of the readout circuits 2 from overlapping one another. This results in efficiently lowering the peak value of the current flowing through the readout circuits 2 when reading data.

Further, according to the second to fifth embodiments, the number of gates, connected in series in the path from the internal nodes N31 and N32 to the next readout circuit 2, i.e., the number of stages of gates of the delay circuit 5a, 5b, and 5c, is equal to the number of gates, connected in series in the path from the internal nodes N31 and N32 to the output node Nout, i.e., the number of stages of gates through which the signal passes in the output latch circuit 4.

It is thus possible to set the respective operating periods of the readout circuits 2 not to overlap one another. This results in efficiently lowering the peak value of the flow of current through the readout circuits 2 when reading data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a plurality of storage elements;
a plurality of readout circuits including a first readout circuit, a second readout circuit different from the first readout circuit, and a third readout circuit different from the first readout circuit and the second readout circuit, the readout circuits each of which determines data stored in a corresponding one of the plurality of storage elements and outputs a result of the determination, in response to receipt of an activation signal;
a first delay circuit connected at a first end to the first readout circuit and connected at a second end to the second readout circuit, the first delay circuit that supplies the activation signal to the second readout circuit with a time interval according to a delay characteristic of the first delay circuit after supplying the activation signal to the first readout circuit; and
a second delay circuit connected at a third end to the second readout circuit and connected at a fourth end to the third readout circuit, the second delay circuit that supplies the activation signal to the third readout circuit with a time interval according to a delay characteristic of the second delay circuit after supplying the activation signal to the second readout circuit, wherein
the first readout circuit comprises a first node that makes a state transition in accordance with the data,
the first delay circuit comprises a sensing circuit that detects completion of the data determination from a state of the first node, and
the first delay circuit supplies the activation signal to the second readout circuit after the sensing circuit detects the completion of the data determination.

2. The storage device according to claim 1, wherein
the first delay circuit supplies the activation signal to the second readout circuit after the first readout circuit completes the data determination in response to receipt of the activation signal.

3. The storage device according to claim 2, wherein
the first readout circuit comprises a cross-coupled latch sense amplifier circuit including the first node and a second node at a cross-coupled part, and
the sensing circuit detects completion of the data determination from a state of the first node and a state of the second node.

4. The storage device according to claim 3, wherein
the first readout circuit further comprises an output circuit that outputs a signal corresponding to the state of the first node, the signal serving as the data after the determination, and
the first delay circuit comprises a number of gates corresponding to amounts of delay in output by the output circuit.

5. The storage device according to claim 3, wherein
the first delay circuit comprises one or more first gates connected in series in a path from the first node to the second readout circuit,
the first readout circuit outputs a signal corresponding to the state of the first node from an output node, the signal serving as the data after the determination,
the first readout circuit comprises one or more second gates connected in series in a path from the first node to the output node, and
the number of the first gates included in the first delay circuit is equal to the number of the second gates included in the first readout circuit.

6. The storage device according to claim 2, wherein
the first readout circuit further comprises an output circuit that outputs a signal corresponding to the state of the first node, the signal serving as the data after the determination, and
the first delay circuit comprises a number of gates corresponding to amounts of delay in output by the output circuit.

7. The storage device according to claim 2, wherein
the first delay circuit comprises one or more first gates connected in series in a path from the first node to the second readout circuit,
the first readout circuit outputs a signal corresponding to the state of the first node from an output node, the signal serving as the data after the determination,
the first readout circuit comprises one or more second gates connected in series in a path from the first node to the output node, and
the number of the first gates included in the first delay circuit is equal to the number of the second gates included in the first readout circuit.

8. The storage device according to claim 1, wherein
the first readout circuit comprises a cross-coupled latch sense amplifier circuit including the first node and a second node at a cross-coupled part, and
the sensing circuit detects the completion of the data determination from a state of the first node and a state of the second node.

9. The storage device according to claim 8, wherein
the first readout circuit further comprises an output circuit that outputs a signal corresponding to the state of the first node, the signal serving as the data after the determination, and
the first delay circuit comprises a number of gates corresponding to amounts of delay in output by the output circuit.

10. The storage device according to claim 8, wherein
the first delay circuit comprises one or more first gates connected in series in a path from the first node to the second readout circuit,
the first readout circuit outputs a signal corresponding to the state of the first node from an output node, the signal serving as the data after the determination,
the first readout circuit comprises one or more second gates connected in series in a path from the first node to the output node, and
the number of the first gates included in the first delay circuit is equal to the number of the second gates included in the first readout circuit.

11. The storage device according to claim 1, wherein
the first readout circuit further comprises an output circuit that outputs a signal corresponding to the state of the first node, the signal serving as the data after the determination, and
the first delay circuit comprises a number of gates corresponding to amounts of delay in output by the output circuit.

12. The storage device according to claim 1, wherein
the first delay circuit comprises one or more first gates connected in series in a path from the first node to the second readout circuit,
the first readout circuit outputs a signal corresponding to the state of the first node from an output node, the signal serving as the data after the determination,
the first readout circuit comprises one or more second gates connected in series in a path from the first node to the output node, and
the number of the first gates included in the first delay circuit is equal to the number of the second gates included in the first readout circuit.

13. The storage device according to claim 1, wherein
the first delay circuit and the second delay circuit includes one or more gates,
the delay characteristic of the first delay circuit is a number of gates included in the first delay circuit, and
the delay characteristic of the second delay circuit is a number of gates included in the second delay circuit.

14. The storage device according to claim 1, wherein
each of the first delay circuit and the second delay includes inverters arranged in series.

15. A storage device comprising:
a plurality of storage elements;
a plurality of readout circuits including a first readout circuit and a second readout circuit different from the first readout circuit, the readout circuits each of which determines data stored in a corresponding one of the plurality of storage elements and outputs a result of the determination, in response to receipt of an activation signal; and
a delay circuit connected at a first end to the first readout circuit and connected at a second end to the second readout circuit, the delay circuit that supplies the activation signal to the second readout circuit with a time interval after supplying the activation signal to the first readout circuit, wherein
the delay circuit supplies the activation signal to the second readout circuit after the first readout circuit completes the data determination in response to receipt of the activation signal, wherein
the first readout circuit comprises a first node that makes a state transition in accordance with the data,
the delay circuit comprises a sensing circuit that detects completion of the data determination from a state of the first node, and
the delay circuit supplies the activation signal to the second readout circuit after the sensing circuit detects the completion of the data determination.

16. The storage device according to claim 15, wherein
the first readout circuit comprises a cross-coupled latch sense amplifier circuit including the first node and a second node at a cross-coupled part, and
the sensing circuit detects completion of the data determination from a state of the first node and a state of the second node.

17. The storage device according to claim 16, wherein
the first readout circuit further comprises an output circuit that outputs a signal corresponding to the state of the first node, the signal serving as the data after the determination, and
the delay circuit comprises a number of gates corresponding to amounts of delay in output by the output circuit.

18. The storage device according to claim 16, wherein
the delay circuit comprises one or more first gates connected in series in a path from the first node to the second readout circuit,
the first readout circuit outputs a signal corresponding to the state of the first node from an output node, the signal serving as the data after the determination,
the first readout circuit comprises one or more second gates connected in series in a path from the first node to the output node, and
the number of the first gates included in the delay circuit is equal to the number of the second gates included in the first readout circuit.

19. The storage device according to claim 15, wherein
the first readout circuit further comprises an output circuit that outputs a signal corresponding to the state of the first node, the signal serving as the data after the determination, and
the delay circuit comprises a number of gates corresponding to amounts of delay in output by the output circuit.

20. The storage device according to claim 15, wherein
the delay circuit comprises one or more first gates connected in series in a path from the first node to the second readout circuit,
the first readout circuit outputs a signal corresponding to the state of the first node from an output node, the signal serving as the data after the determination,
the first readout circuit comprises one or more second gates connected in series in a path from the first node to the output node, and
the number of the first gates included in the delay circuit is equal to the number of the second gates included in the first readout circuit.

* * * * *